(12) United States Patent
Koechlin et al.

(10) Patent No.: US 8,610,477 B2
(45) Date of Patent: Dec. 17, 2013

(54) WIDEBAND ANALOG PHASE SHIFTER

(75) Inventors: Michael Koechlin, Chelmsford, MA (US); Cemin Zhang, Nashua, NH (US)

(73) Assignee: Hittite Microwave Corporation, Chelmsford, MA (US)

( * ) Notice: Subject to any disclaimer, the term of this patent is extended or adjusted under 35 U.S.C. 154(b) by 56 days.

(21) Appl. No.: 13/068,123

(22) Filed: May 3, 2011

(65) Prior Publication Data

US 2011/0267119 A1    Nov. 3, 2011

Related U.S. Application Data

(60) Provisional application No. 61/343,740, filed on May 3, 2010.

(51) Int. Cl.
*H03H 11/16* (2006.01)

(52) U.S. Cl.
USPC ............ 327/231; 327/553; 333/103; 333/172

(58) Field of Classification Search
USPC .......... 327/231–234, 400, 551–553; 333/103, 333/132, 136, 172, 185
See application file for complete search history.

(56) References Cited

U.S. PATENT DOCUMENTS

| | | | | |
|---|---|---|---|---|
| 3,882,425 A | * | 5/1975 | Briley | 332/159 |
| 4,638,269 A | | 1/1987 | Dawson et al. | |
| 4,852,080 A | * | 7/1989 | Ohtake et al. | 370/295 |
| 4,894,566 A | * | 1/1990 | Rush | 327/311 |
| 4,961,062 A | | 10/1990 | Wendler | |
| 5,119,050 A | | 6/1992 | Upshur et al. | |
| 6,983,129 B2 | * | 1/2006 | Satoh et al. | 455/82 |
| 7,276,993 B2 | | 10/2007 | York | |

* cited by examiner

*Primary Examiner* — An Luu

(74) *Attorney, Agent, or Firm* — Iandiorio Teska & Coleman, LLP

(57) ABSTRACT

A phase shifter includes a low-pass filter, a high-pass filter, and an all-pass filter coupled in series between an RF input terminal and an RF output terminal of the phase shifter, at least one of the filters being tunable, controlling the phase of an input signal over a wide range of frequencies.

20 Claims, 11 Drawing Sheets

Bonding diagram of Die in surface mount package

WIDEBAND ANALOG PHASE SHIFTER

RELATED APPLICATIONS

This application claims benefit of and priority to U.S. Provisional Application Ser. No. 61/343,740 filed May 3, 2010 under 35 U.S.C. §§119, 120, 363, 365, and 37 C.F.R. §1.55 and §1.78, incorporated herein by this reference.

FIELD OF THE INVENTION

The subject invention relates to a phase shifter.

BACKGROUND OF THE INVENTION

There are many applications in which it is desirable to control the phase of a signal over a wide range of frequencies with nearly linear phase change with input control voltage (or current). It is also desirable to have that phase tuning sensitivity be nearly constant over the entire operating frequency range. This is useful when it is necessary to phase modulate signals over a wide range of frequencies with the goal of obtaining the same phase modulation independent of frequency for the same input stimulus. Another very desirable attribute is to have a range of phase adjustment greater than 360 degrees to be able to reach all possible phase states across the specified frequency range. In addition it is also very desirable to achieve the above described performance with relatively low and flat insertion loss.

One prior art phase shifter that attempted to address these problems is disclosed in U.S. Pat. No. 4,961,062. In this case an analog phase shifter is provided by cascading T high-pass filter and π low-pass filter sections. The high-pass filter section provide more phase shift as a function of input tuning voltage at the low end of the operating frequency range and less at the high end. The low-pass filter does the opposite providing more phase shift at the high end of the operating frequency range and less at the low end. When combined the two filters together may provide a "U-shaped" phase shift response vs. frequency with the most phase shift and highest phase tuning sensitivity occurring at the extreme low and high ends of the frequency range and the least phase shift and phase tuning sensitivity occurring in the middle of the frequency range. In the example given a variable phase shifter covering the frequency range of 6 to 18 GHz has a total phase range of ~95° at either end of the band and ~55° in the center.

The analog phase shifter of the '062 patent includes a T-section high-pass filter network and a π-section low-pass filter network. The low-pass π-network includes a fixed inductance element and a pair of variable capacitance elements connected in shunt, and the T-network includes a pair of variable capacitance elements connected in series and an inductive element connected in shunt. By cascade connecting the high-pass and low-pass filter sections, a composite phase shift characteristic may be obtained which forms a "U-shaped" phase shift response vs. frequency.

The user of such an analog phase shifter preferably ensures that the phase-frequency response of T-section high-pass filter is more abrupt than the π-section low-pass filter, and the overall phase shift over the bandwidth is not constant due to the "U-shaped" nature of the phase shift response vs. frequency. Also, in order to increase the total phase shift range, higher filter orders may be required for both high-pass filter and low-pass filter, which leads to an even worse phase shift variation over frequency when large overall phase shift is demanded.

The current analog phase shifters that use a low-pass filter section cascaded with a high-pass filter section suffer from certain disadvantages. Due to the "U-shape" phase-frequency response, the phase shift variation over frequency is typically large between the center of the frequency band and the high/low end of the frequency band. Also, these phase shifters also typically provide limited phase shift range at the frequency of interest, usually near the center of the frequency band.

Another prior art phase shifter that attempted to address the above problems is disclosed in U.S. Pat. No. 7,276,993. In this instance multiple all-pass networks tuned to different center frequencies are cascaded to provide a relatively flat response over a specified range of frequency.

The analog phase shifter of the '993 patent includes two or more cascaded all-pass sections with each section centered at a distinct frequency. Typically, the use of a single all-pass filter by itself would not provide a flat response over a range of frequencies, but by cascading multiple all-pass sections tuned at different center frequencies, the cumulative phase shift response curves results in a composite frequency-phase response that may provide a relatively flat phase over a specified range of frequencies.

There are also drawbacks from cascading multiple all-pass sections centered at different frequencies. Typically, these filters have degraded overall input/output return loss due to the narrowband nature of each single all-pass section. Two or more all-pass sections at the same (or similar) center frequency may be required to provide a necessary overall phase shift range due to the limited phase shift range for the single all-pass section. This may degrade the insertion loss by a factor of two or more.

Another method previously employed is to use a reflection-type phase shifter, as disclosed for example in U.S. Pat. Nos. 4,638,269 and 5,119,050. In such analog phase shifters, a pair of varactor diodes is serially connected to each of the phase shifting ports of a 3 dB hybrid coupler. However, the bandwidth of such type of analog phase shifter is limited and the insertion loss is generally high due to the limited bandwidth and the extra loss introduced by the 3 dB coupler.

BRIEF SUMMARY OF THE INVENTION

This invention results from the realization that a wideband analog phase shifter configured by cascading a low-pass filter, an all-pass filter and a high-pass filter flattens out the phase and amplitude response and provides a large cumulative phase shift with a relatively linear phase response over the input control voltage range. The phase shift response is nearly constant over the operating frequency range. The wideband analog phase shifter has low insertion loss variation over all phase states and is readily implementable in Monolithic Microwave Integrated Circuit (MMIC).

In one embodiment, this invention features a phase shifter, including an RF input terminal, an RF output terminal, a low-pass filter, a high-pass filter, and an all-pass filter coupled in series between the RF input and the RF output terminals of the phase shifter, said filters being tunable for controlling the phase of a signal over a wide range of frequencies.

In a preferred embodiment, a center frequency of the all-pass filter may be approximately a center frequency of the phase shifter. The all-pass filter may be coupled in series between the low-pass filter and the high-pass filter. The low-pass filter may be a fifth order filter or higher. The low-pass filter may be a fourth order filter or lower. The low-pass filter may be a fifth order filter and may include two inductors in series with the input terminal and three variable capacitors each coupled between ground and at least one of the terminals of the two inductors. The variable capacitors each may include a varactor diode. The high-pass filter may be a fifth order filter or higher. The high-pass filter may be a fourth order filter or lower. The high-pass filter may be a fifth order filter and may include two pairs of variable capacitors all coupled in series, each pair having a junction therebetween, and first and second inductors each coupled between ground and one of the junctions. The variable capacitors may include a varactor, and the phase shifter may further include a plurality of resistances and RF chokes each coupled in series between a DC bias control terminal and one of the varactors. The high-pass filter may be tunable by a DC control signal at the DC bias control terminal. The DC basis control terminal is also coupled to the low-pass and all-pass filters such that each of the filters is tuned simultaneously with the DC bias control signal. The DC bias control terminal is coupled to one or more varactors in each of the filters through one or more bias chokes. The all-pass filter section may include two inductors coupled in series between the input and output of the all-pass filter; two series coupled variable capacitors coupled in parallel with the two inductors; a shunt variable capacitor coupled to a junction between the two inductors; and a shunt bias network coupled to a junction between the two variable capacitors. The low-pass filter may have a cut-off frequency at or above the highest frequency in a frequency pass band of the phase shifter. The high-pass filter may have a cut-off frequency at or below the lowest frequency in a frequency pass band of the phase shifter. Each filter is configured to provide approximately constant transmission phase change over a frequency band ranging from the low-pass filter cutoff frequency to the high-pass filter cutoff frequency as a function of a common filter tuning signal. The frequency band is approximately one octave or more.

In another embodiment, this invention features a wideband analog phase shifter including an RF input terminal, an RF output terminal, a tunable low-pass filter, a tunable high-pass filter, and an tunable all-pass filter. One of the low-pass filter and the high-pass filter are coupled to the RF input terminal and the other is coupled to the RF output terminal. The tunable all-pass filter is coupled in series between the low-pass filter and the high-pass filter and responsive to a DC tuning signal for controlling the phase of an input RF signal over a wide range of frequencies.

In yet another embodiment, this invention further features a phase locked oscillator, which includes an amplifier for providing an output signal. A prescaler is responsive to the amplifier for providing a divided output signal. A phase detector is responsive to a reference signal and the prescaler for providing a control signal representative of the phase difference between the reference signal and the signal from the prescaler. A loop filter is responsive to the phase detector for filtering the control signal to provide a filtered control signal. An analog phase shifter is responsive to the loop filter for controlling the oscillator frequency and phase, the phase shifter including: an RF input terminal, an RF output terminal, a low-pass filter, a high-pass filter, and an all-pass filter coupled in series between the RF input and the RF output terminals of the phase shifter, said filters tunable for controlling the phase of a signal over a wide range of frequencies.

In yet another embodiment, this invention further features an electrically tunable all-pass filter comprising: first and second series connected inductors connected in parallel with first and second series connected electrically tunable variable capacitors; a shunt electrically tunable variable capacitor connected to the junction of said first and second inductors, and a shunt bias network connected to the junction of said first and second variable capacitors.

In a preferred embodiment, the electrically tunable all-pass filter in which the shunt bias network includes a series connected bias resistance and bias inductor. The shunt variable capacitor may be connected to ground. Each of said electrically tunable variable capacitors may include a varactor. Each of the varactors may include a diode. Each of the varactors may include two diodes with like electrodes coupled together. Each of the varactors may include a pn junction. Each of the varactors may include a field effect transistor. The electrically tunable variable capacitor may include a ferroelectric capacitor. The electrically tunable variable capacitor may include a MEMS based capacitor. The all-pass filter may be implemented on a planar monolithic substrate. The planar monolithic substrate may be selected from the group of GaAs and SiGe. The planar monolithic substrate may be selected from the group of GaAs and SiGe mounted on a surface-mount package.

BRIEF DESCRIPTION OF THE SEVERAL VIEWS OF THE DRAWINGS

Other objects, features and advantages will occur to those skilled in the art from the following description of a preferred embodiment and the accompanying drawings, in which.

DETAILED DESCRIPTION OF THE INVENTION

Figure 1:
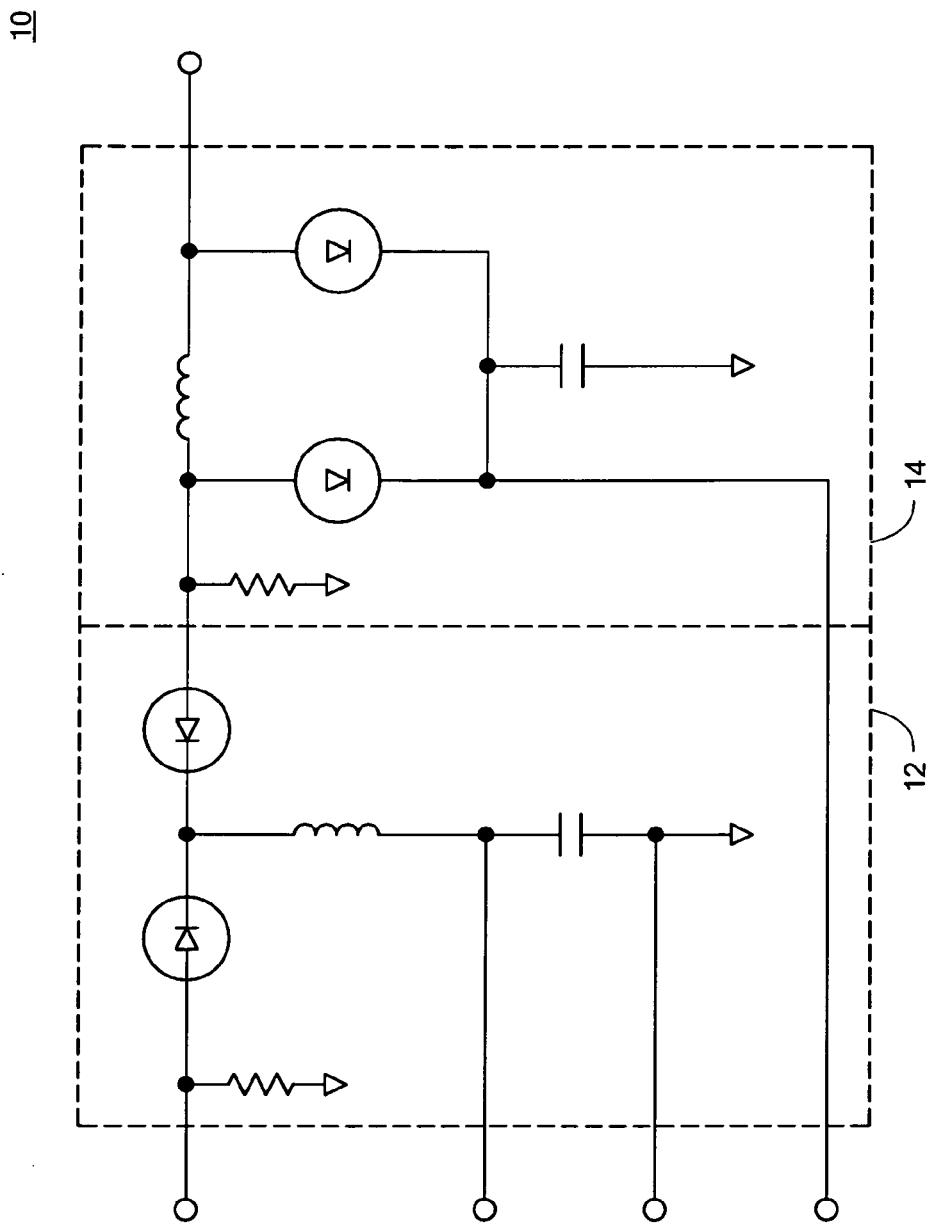
FIG. 1 is a circuit diagram of prior art phase shifter.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the invention is not to be limited to that embodiment.

The prior art phase shifter 10 disclosed in U.S. Pat. No. 4,961,062 is shown in FIG. 1. Analog phase shifter 10 includes a cascaded T high-pass filter section 12 and a π low-pass filter section 14. The high-pass filter section 12 provides more phase shift as a function of input tuning voltage at the low end of the operating frequency range and less at the high end. Low-pass filter section 14 does the opposite by providing more phase shift at the high end of the operating frequency range and less at the low end.

As described in the Background of the Invention, such an analog phase shifter that uses a low-pass filter section cascaded with a high-pass filter section may suffer from certain disadvantages. Due to the "U-shape" phase-frequency response, the phase shift variation over frequency is typically large between the center of the frequency band and the high/low ends of the frequency band. Also, these phase shifters also typically provide limited phase shift range at the frequency of interest, usually near the center of the frequency band.

Figure 2:
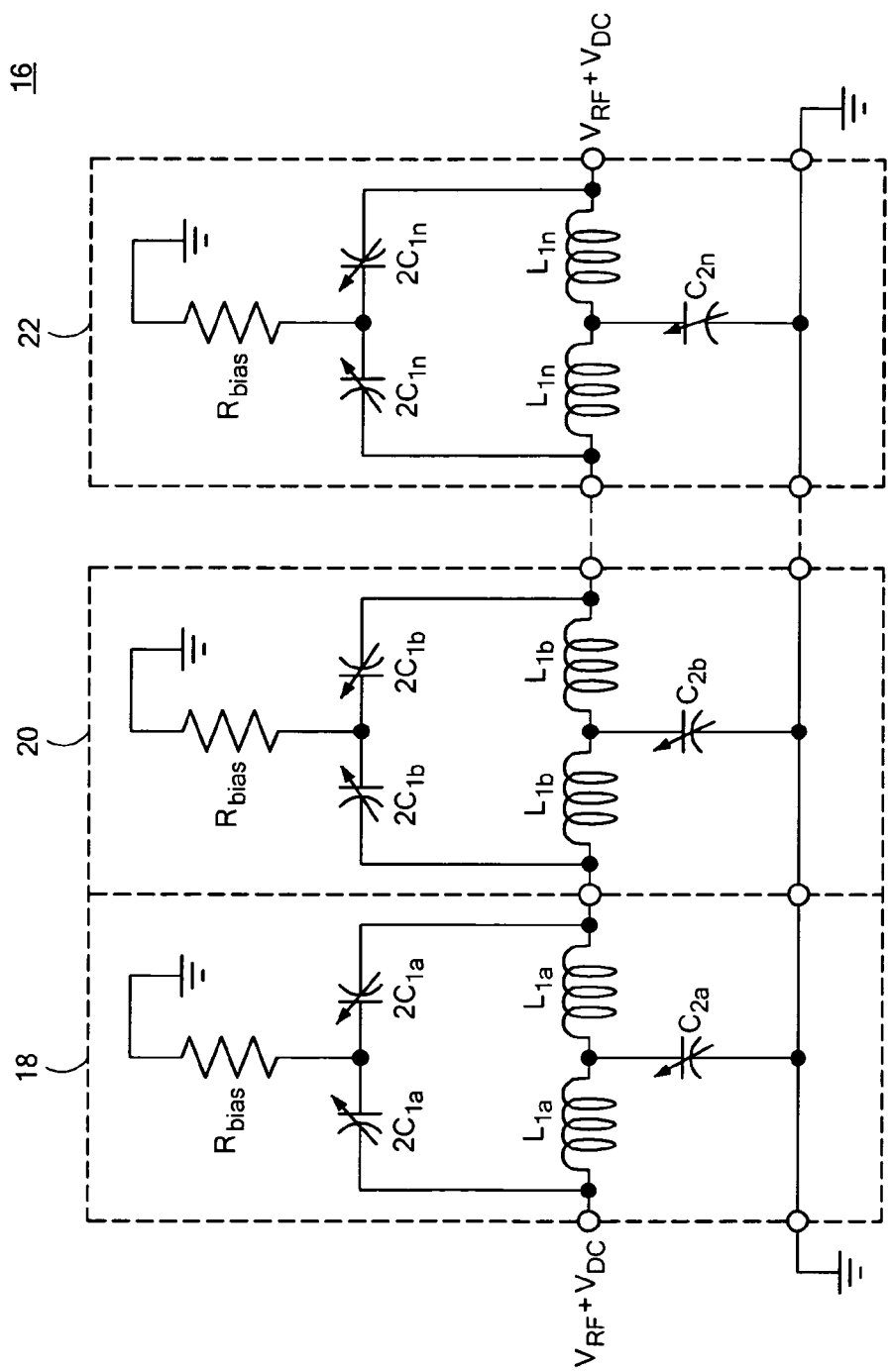
FIG. 2 is a circuit diagram of another prior art phase shifter.

The prior art phase shifter 16 disclosed in U.S. Pat. No. 7,276,993 is shown in FIG. 2. In the '993 patent, two or more all-pass networks 18-22 include components tuned to different center frequencies and cascaded to provide a relatively flat response over a specified range of frequency.

As described above, there are also drawbacks from cascading multiple all-pass sections centered at different frequencies. Typically, these filters have degraded overall input/output return loss due to the narrowband nature of each single all-pass section. Two or more all-pass sections at the same (or similar) center frequency may be required to provide a necessary overall phase shift range due to the limited phase shift range for the single all-pass section. This may degrade the insertion loss by a factor of two or more.

Figure 3:
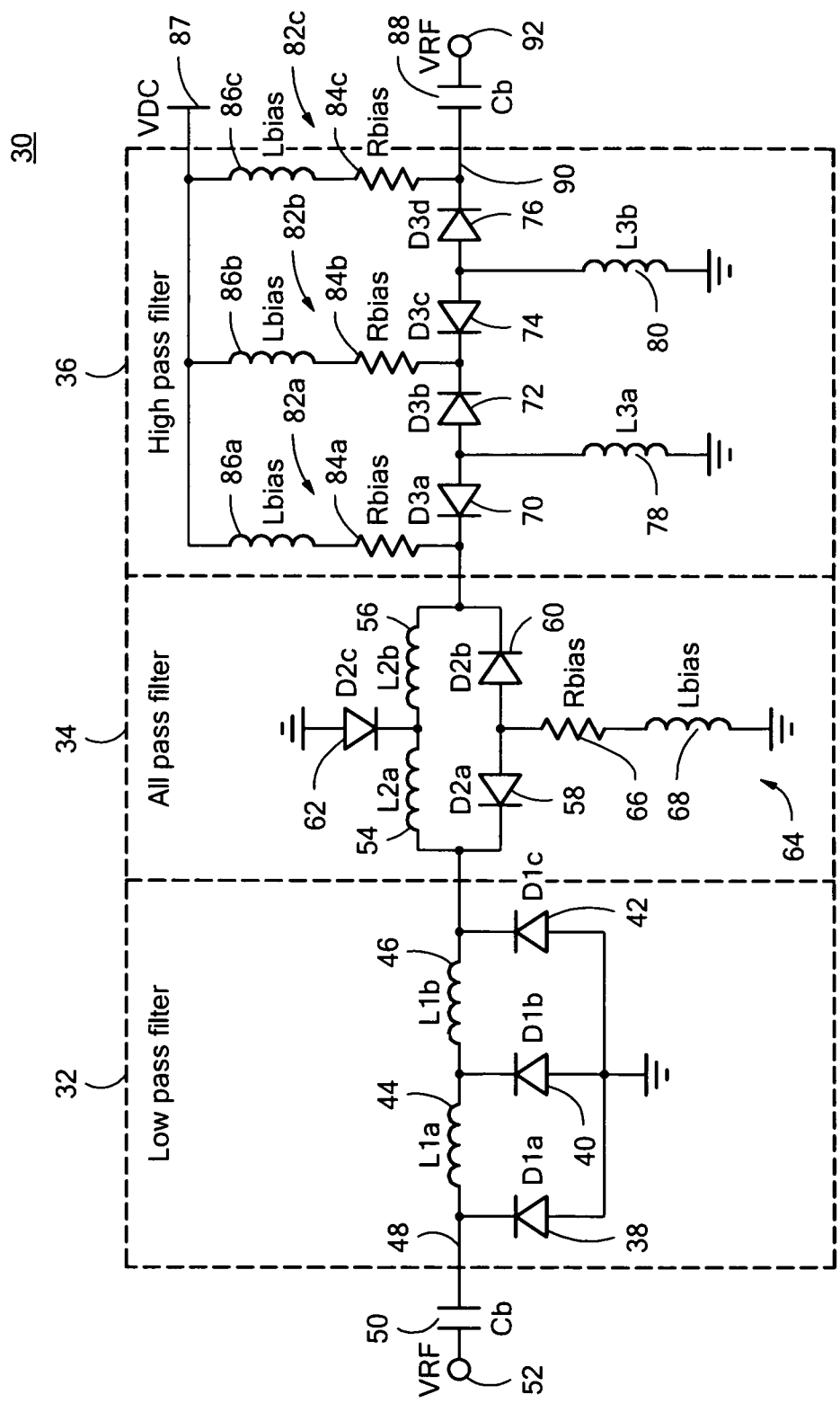
FIG. 3 is a circuit diagram schematic of an analog phase shifter in accordance with one embodiment of the subject invention.

There is shown in FIG. 3 a preferred embodiment of an analog phase shifter 30 in accordance with one embodiment of the subject invention. Phase shifter 30 includes a low-pass filter 32, an all-pass filter 34 and a high-pass filter 36 cascaded in series. Preferably, all-pass filter section 34 is placed between low-pass filter 32 and high-pass filter 36, but this is not a limitation of the invention since filters 32-36 may be cascaded in different orders.

In a preferred embodiment, low-pass filter 32 includes three variable capacitors 38, 40 and 42 in shunt with the radio-frequency (RF) signal path, and two fixed inductors 44 and 46 in series with the input terminal 48. Variable capacitors 38, 40 and 42 may each include a varactor diode. Low-pass filter 32 is shown as a fifth order tunable low-pass filter, but the filter order could be further increased (or decreased) to provide more (or less) phase shift range if desired. However, the higher the filter order, the worse the associated insertion loss. Low-pass filter 32 is preferably designed to have a cut-off frequency at or above the highest frequency in the frequency pass band of the analog phase shifter. A fixed capacitor 50 is coupled between the RF input terminal 52 and the input 48 of low-pass filter 32 for D.C. blocking.

In a preferred embodiment, all-pass filter 34 includes two fixed inductors 54 and 56 in parallel with two variable capacitors 58 and 60. A shunt variable capacitor 62 is coupled between the junction of inductors 54 and 56. The capacitance of variable capacitors 58 and 60 are preferably identical and roughly half of the capacitance of variable capacitor 62. A shunt bias network 64, which is formed by a resistance 66 in series with an RF choke 68, is connected to the junction of variable capacitors 58 and 60 and ground to provide a DC return path for variable capacitors 58 and 60.

In a preferred embodiment, high-pass filter 36 includes four variable capacitor elements 70, 72, 74 and 76 in series with the RF signal path, and two fixed inductor elements 78 and 80 in shunt with the RF signal path. Preferably, the capacitance of back-to-back variable capacitors 70 and 72 are identical and the capacitance of 74 and 76 are also identical. High-pass filter 36 forms a fifth order tunable high-pass filter, where the filter order could be further increased (or decreased) to provide more (or less) phase shift range if required. The same as low-pass filter section 32, the phase shift range provided by high-pass filter 36 section is traded off with the insertion loss. High-pass filter 36 is designed to have a cut-off frequency at or below the lowest frequency in the frequency pass band of analog phase shifter 30.

Shunt bias networks 82*a-c* of high-pass filter 36 are formed respectively by a resistance 84*a-c* in series with an RF choke 86*a-c* connected between a DC bias control port 87 and one of the cathodes of varactor diodes 70-76. The entire analog phase shifter may require only a single DC control line. The values of bias resistors 84*a-c* and the tunable capacitor together determine the modulation bandwidth. The larger values of bias resistors 84*a-c* would provide a better isolation between RF signal path and the DC control port, however, the modulation bandwidth will decrease accordingly. A fixed capacitor 88 is coupled between the output 90 of high-pass filter 36 and output RF terminal 92 for the purpose of D.C. blocking.

In addition to being coupled to high pass filter 36, DC bias control port 87 is also coupled to varactors 38, 40, and 42 in the low-pass filter via inductors 44, 46, 54, 56, and 86*a*. DC bias control port 87 is also coupled to varactors 58, 60 and 62 in the all-pass filter section via inductors 54, 56, and 86*a*. Thus, the varactors of each of filters 32, 34 and 36 may be electrically tuned via the DC bias control port 87.

The component values for each of filters 32, 34 and 36 are preferably selected to provide approximately constant transmission phase change over a frequency band ranging from the low-pass filter cutoff frequency to the high-pass filter cutoff frequency as a function of a common filter tuning signal. Preferably, this frequency band is approximately one octave or more.

Each of the variable capacitors including the electrically tunable capacitors shown in FIG. 3 may include one or more different elements. For example, each variable capacitor shown in FIG. 3 may include a varactor. Each varactor may include two diodes coupled together in an anode to anode or cathode to cathode configuration. Each of the varactors may alternatively include one diode. Each of the varactors may include a pn junction. Each of the varactors may include a field effect transistor (FET) and use the capacitance between a gate and a source of the FET. Each variable capacitor may include a ferroelectric based capacitor. Each variable capacitor may include a MEMS-based capacitor.

Figure 4:
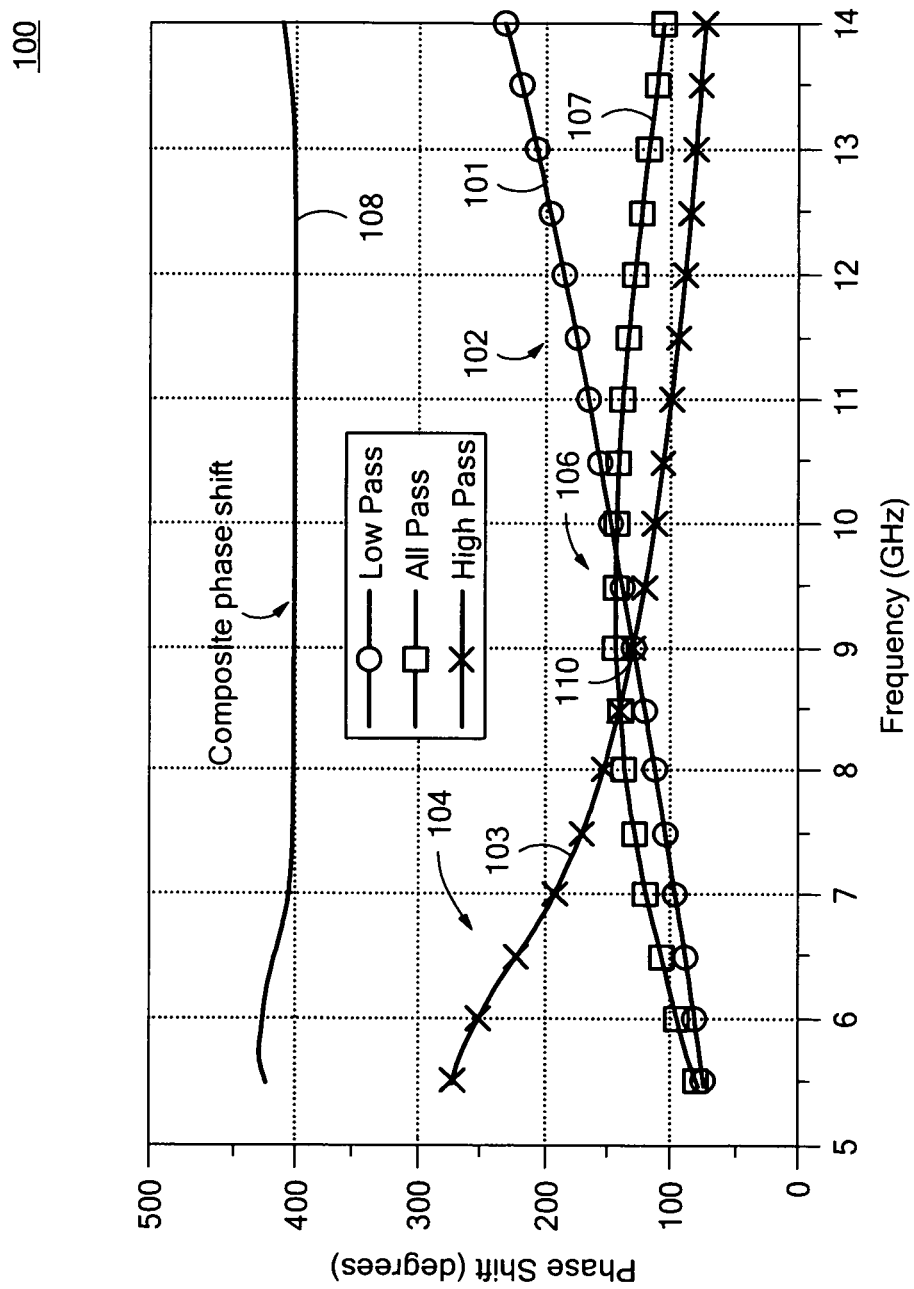
FIG. 4 is a plot showing the phase shift response of an X-band analog phase shifter and the phase shift contributions from each filter section.

As shown in FIG. 4, the phase shift response 100 of an exemplary X-band analog phase shifter demonstrates an extremely flat phase-frequency response from 7 to 13 GHz. The total phase shift is around 400 degrees. The phase shift response curve 101 of low-pass filter 32 shows that it provides a larger phase shift at the higher frequency band 102. The phase shift response curve 103 of high-pass filter 36 shows that it contributes a larger phase shift at the lower frequency band 104. The all-pass filter 34, on the other hand, provides the most phase shift around the center 106 of the frequency band as shown by its phase shift response curve 107. The cumulative phase shift response curves result in a composite frequency-phase response 108 that provides a flat overall phase shift over a wide range of frequencies. The center frequency 110 of the all-pass filter section 34 is tuned slightly lower (i.e. near 9 GHz for this case) to compensate the abrupt variation of phase-frequency response of the high-pass filter at low frequency band. The total available phase shift is controlled by the number of filter order of the low-pass and high-pass filter sections and is generally traded-off with the insertion loss.

Figure 5:
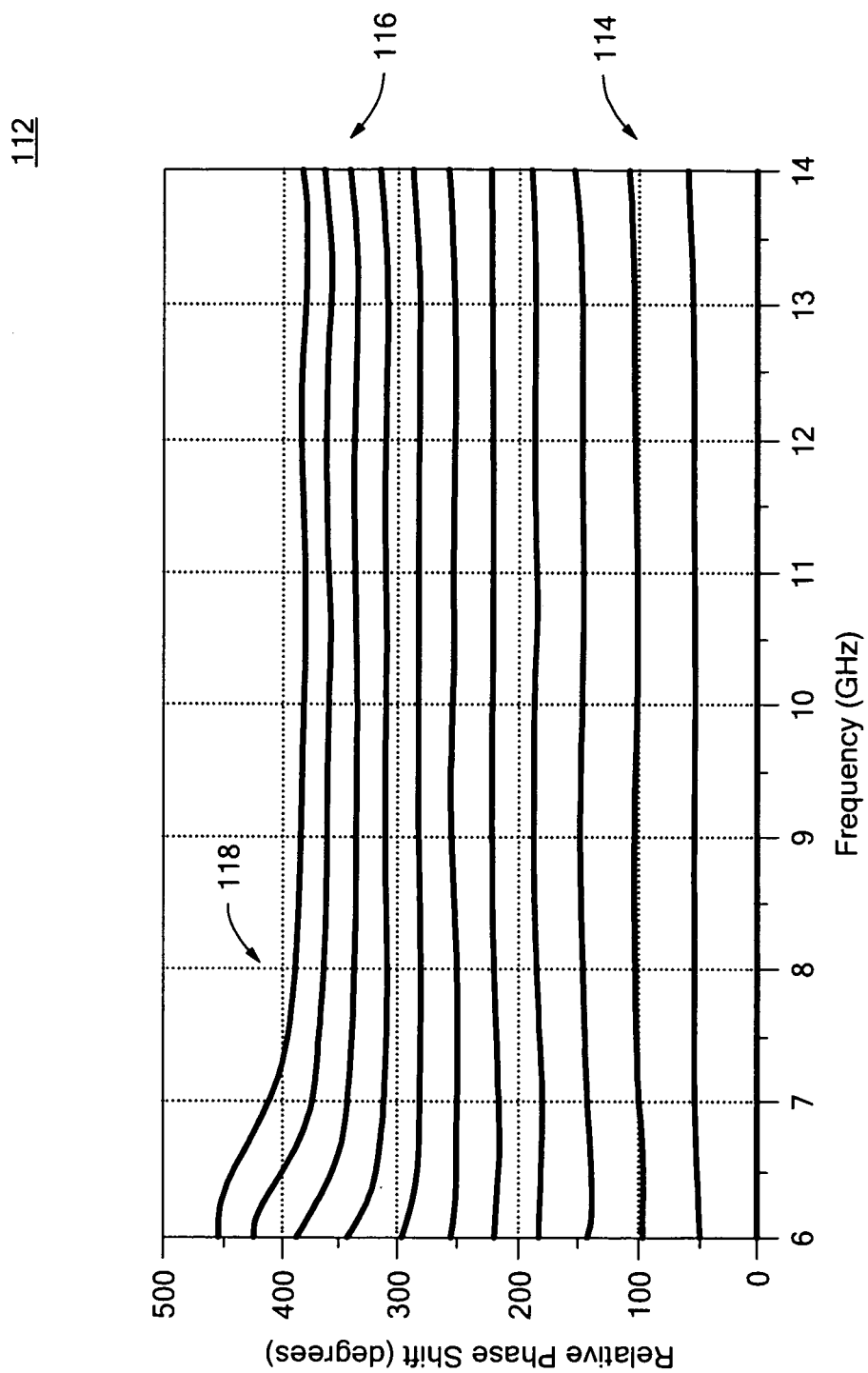
FIG. 5 is a plot showing the phase shift characteristic as a function of frequency for various control voltages.

A plot 112, FIG. 5, shows the phase shift characteristic as a function of frequency for various control voltages from 0.5 volt to 11.5 volts, with 1 volt per step. It is noted that the phase shift response is even more flat over frequency at lower tuning voltages 114. At higher tuning voltages 116, the abrupt phase shift of high-pass filter section become more apparent since the flatness of phase-frequency response degrade at the low frequency band 118.

Figure 6:
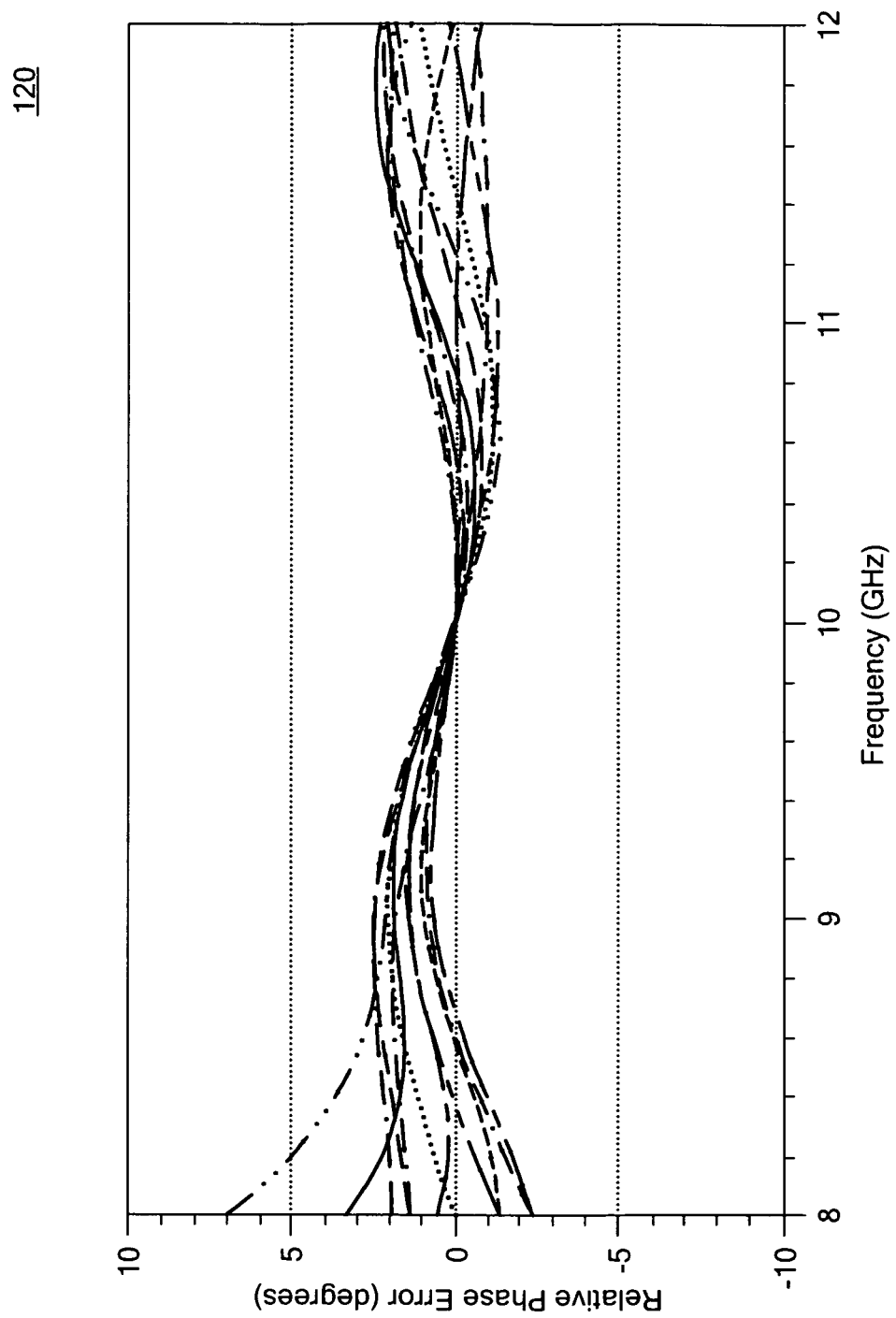
FIG. 6 is a plot showing the relative phase error as a function of frequency for various control voltages referred to the center frequency.

Graph 120, FIG. 6, shows the relative phase error as a function of frequency for various control voltages referred to the center frequency (i.e. 10 GHz for this case). The phase error is within +/−5 degrees under all tuning states from 8 GHz to 12 GHz. Such error is comparable to digital phase shifter but it provides continuous tuning and requires only single control voltage.

Figure 7:
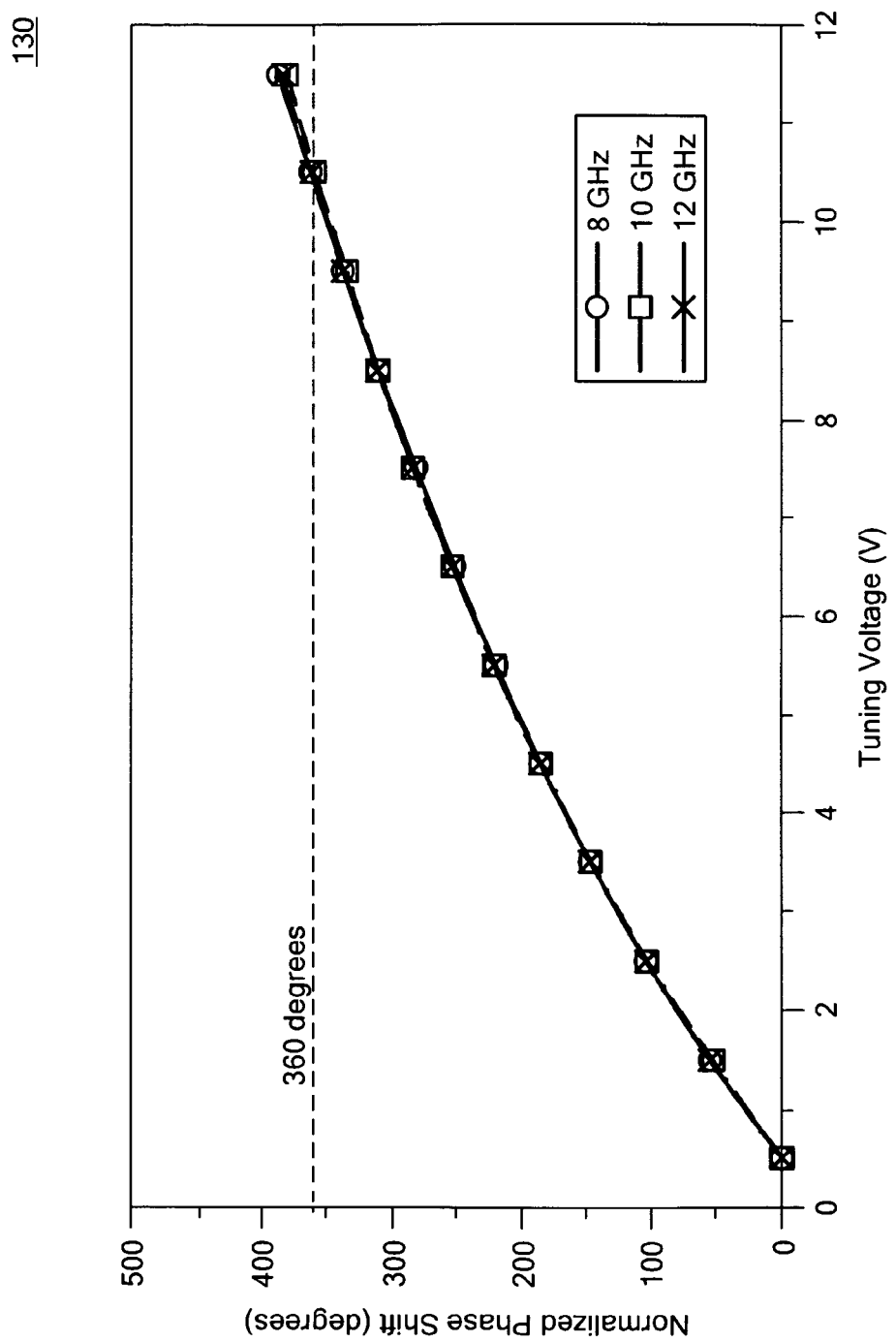
FIG. 7 is a graph showing the relative phase shift characteristic as a function of tuning voltage.

Graph 130, FIG. 7, shows the relative phase shift characteristic as a function of tuning voltage at 8 GHz, 10 GHz and 12 GHz, respectively. The relative phase shift is referred to the tuning voltage of 0.5 volt. It demonstrates a relatively linear phase response as the function of input control voltages. The linearity of phase shift response is typically better when the control voltage is less than 3.5 volts.

Figure 8:
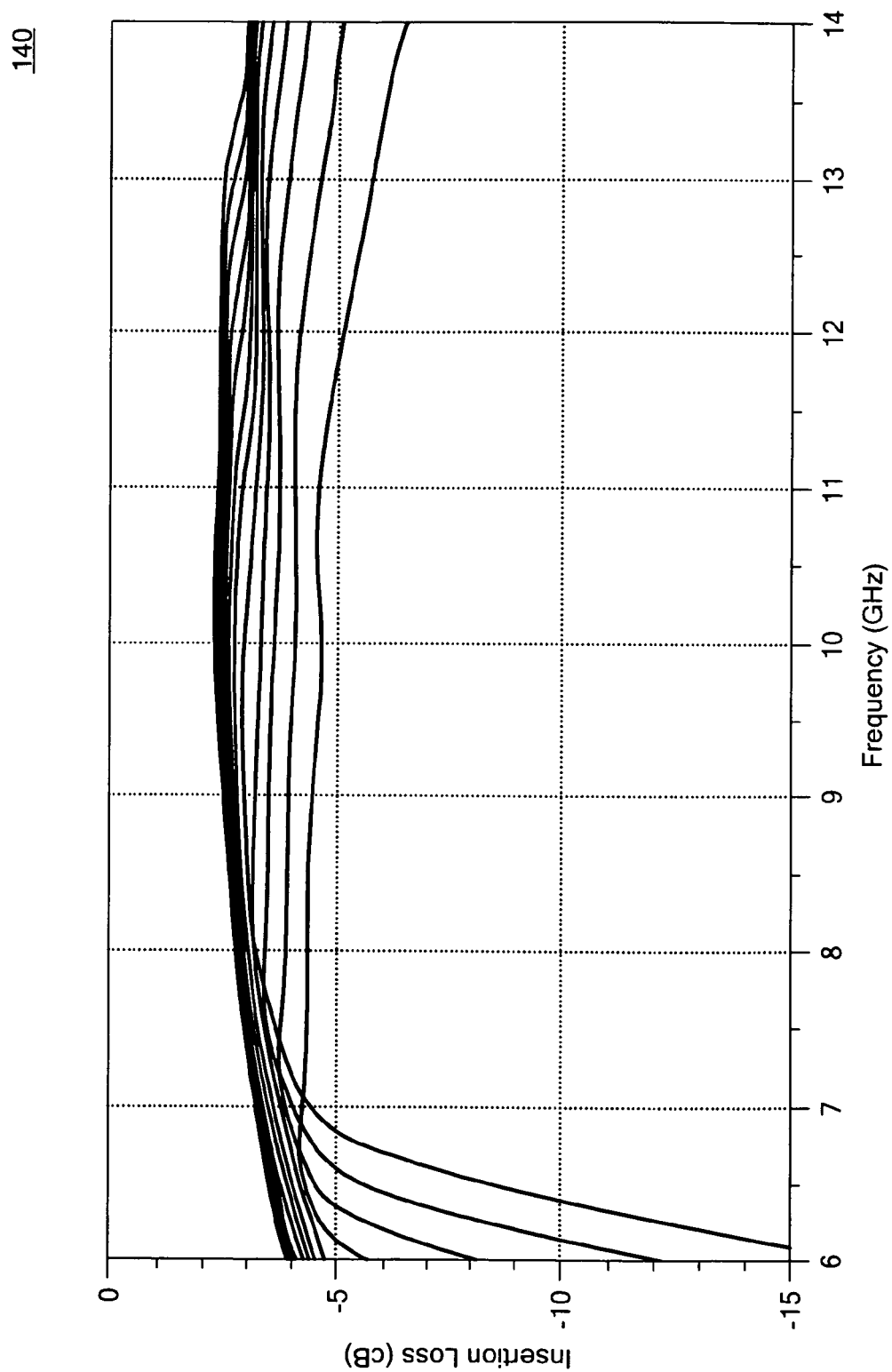
FIG. 8 is a graph showing the insertion loss of the analog phase shifter at various control voltages.

Graph 140, FIG. 8, shows the insertion loss of the subject analog phase shifter at various control voltages from 0.5 volts to 11.5 volts. The insertion loss is typically between −3 dB and −5 dB over all phase states from 7 GHz to 12 GHz.

Figure 9:
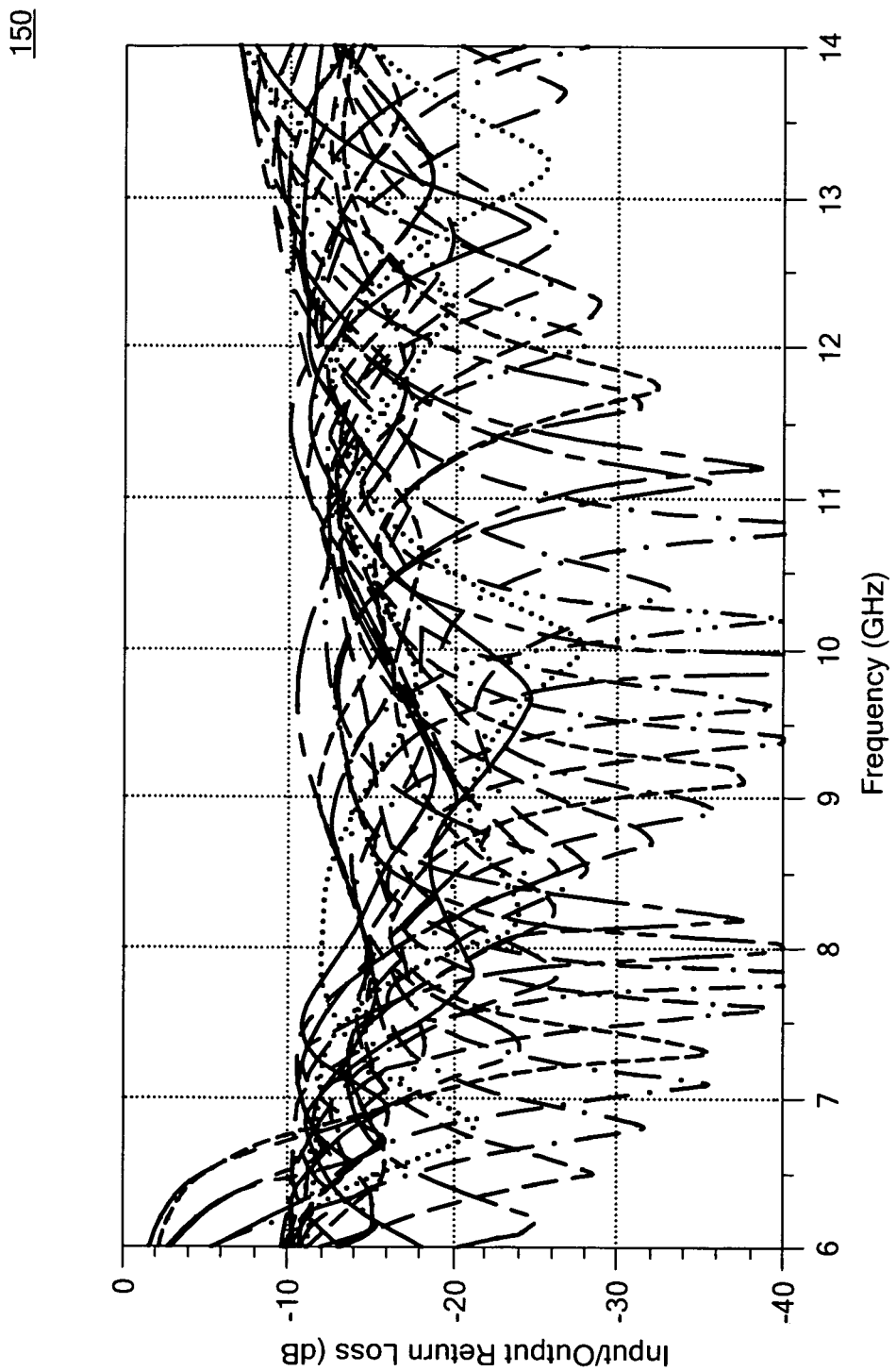
FIG. 9 is a graph showing the return loss at input and output ports of the analog phase shifter at various control voltages.

Graph 150, FIG. 9, shows the return loss at input and output ports of the subject analog phase shifter at various control voltages from 0.5 volt to 11.5 volts. The return loss is typically better than −10 dB over all phase states from 7 GHz to 12 GHz.

Embodiments of the subject invention provide several improvements over the current art. By introducing one stage of all-pass filter section between the low-pass and high-pass sections, it provides more phase shift at the center of frequency and improves the phase shift flatness over a wide frequency range. The order and number of the low-pass and high-pass filter sections may be optimized to provide necessary phase shift (for example, over 360 degrees) and affordable insertion loss over a wide bandwidth. The use of an all-pass filter section with the low-pass and high-pass sections may also allow the use of higher order low-pass and high-pass filters.

The values of fixed inductors and variable capacitors may be selected such that the cascaded networks provide a nearly constant phase shift characteristic as a function of frequency over the frequency bandwidth of the subject analog phase shifter.

The center frequency of all-pass filter 34 may be located near the center frequency of phase shifter 30, and is slightly closer to the low frequency band to compensate for the abrupt phase-frequency response of high-pass filter 36 thus providing a flat phase response as a function of the frequency.

There are several different combinations for the arrangement of the order of low-pass filter (LP) 32, all-pass filter (AP) 34, and high-pass filter (HP) 36, for example, LP-AP-HP (or HP-AP-LP), AP-LP-HP (or HP-LP-AP), LP-HP-AP (or AP-HP-LP), where the input and output are interchangeable. Among the different combinations, putting the all-pass filter 34 between the low-pass filter 32 and high-pass filter 36 (i.e. LP-AP-HP or HP-AP-LP) is generally preferred for better performance.

This concept can be easily applied to different low-pass filter, high-pass filter and all-pass filter topologies including the differential embodiments.

It is desirable to be able to realize this circuit in a monolithic fashion to benefit from the consistency of the many reactive elements, reduced size, low cost, and the possibility to integrate other active or passive circuit functions on the same die. The filter may be implemented on a planar monolithic substrate. The monolithic substrate may be selected from the group of GaAs or SiGe. The monolithic substrate may be mounted on a surface-mount package. Each of the inductors may be a lumped inductor. Each of the inductors may be a spiral inductor.

Figure 10:
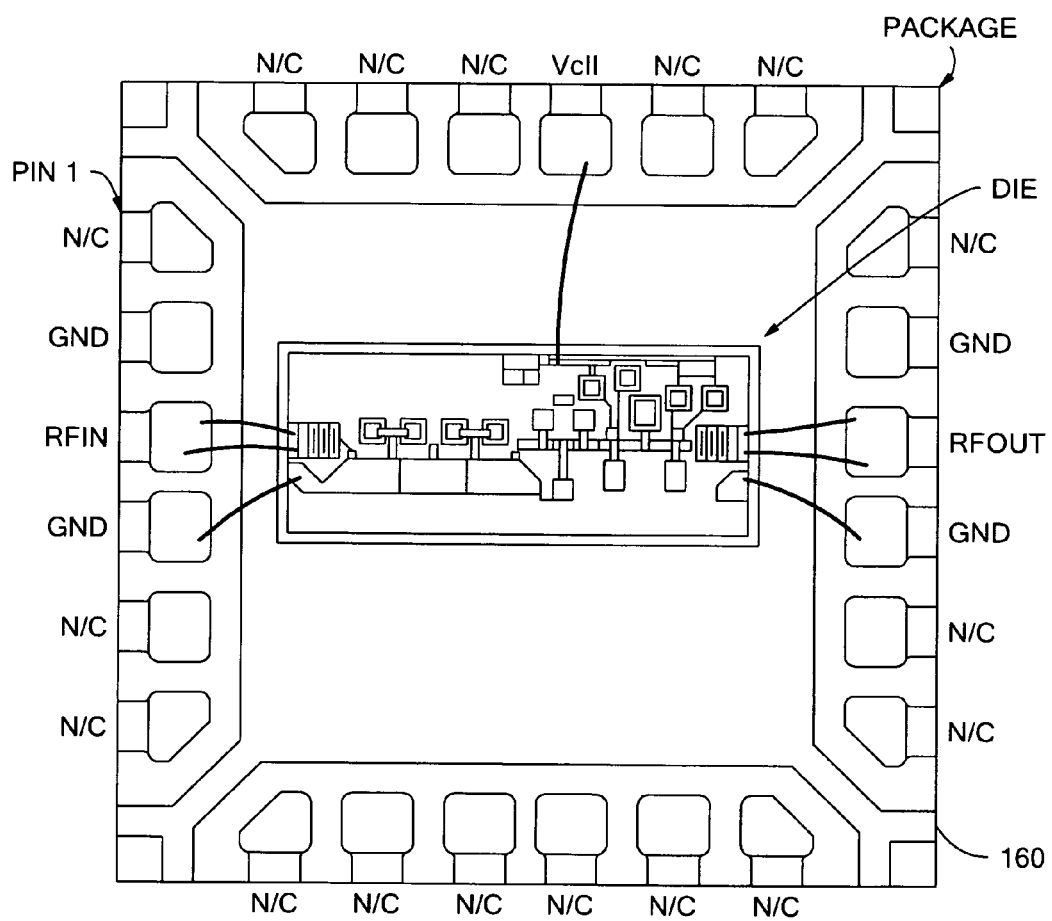
FIG. 10 is a bonding diagram of an exemplary die including one embodiment of the subject invention in a surface mount package.

The layout and bonding diagram 160, FIG. 10, of the Monolithic Microwave Integrated Circuit (MMIC) die shows how the MMIC die may be assembled into a surface mount package.

Figure 11:
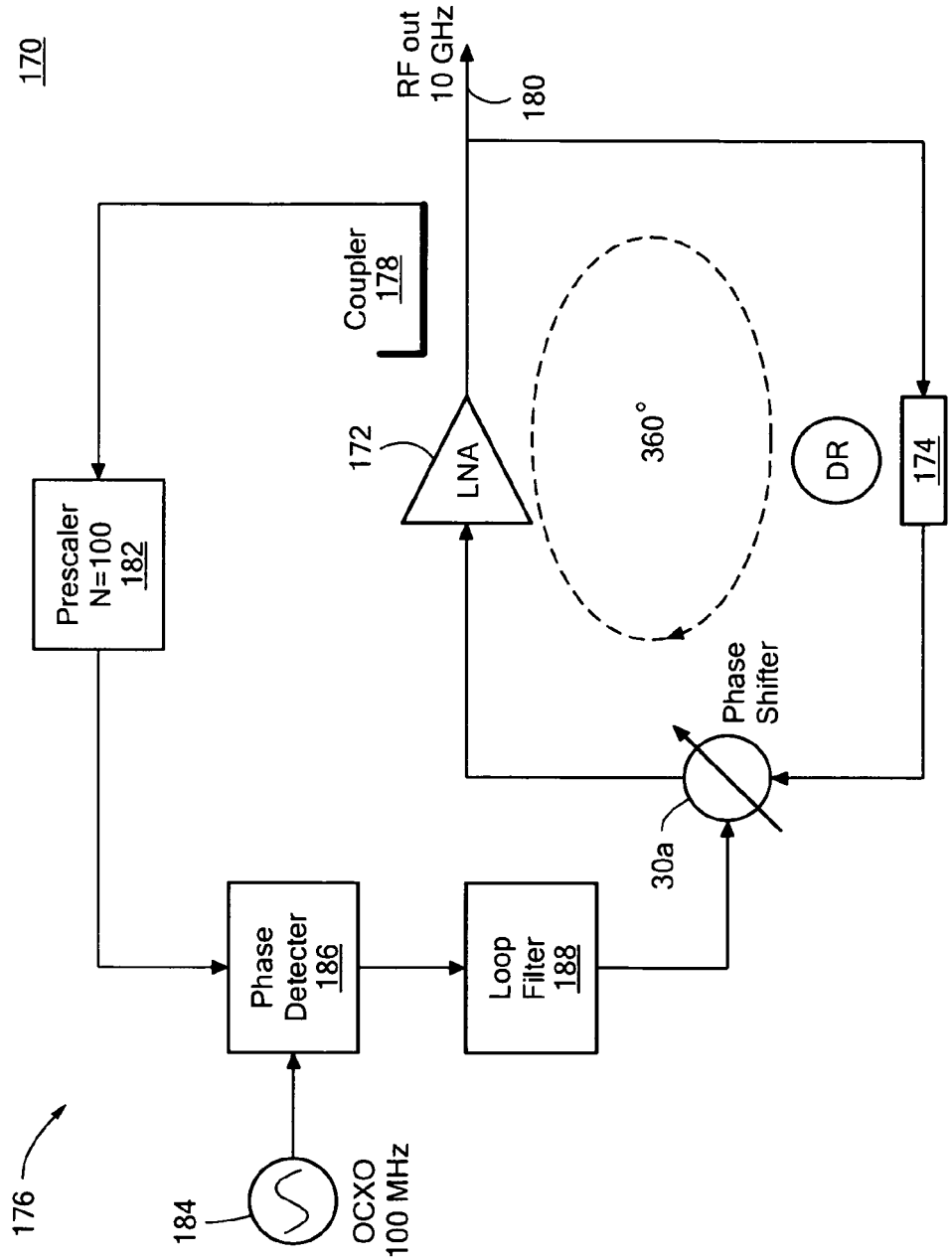
FIG. 11 is a schematic of an exemplary phase locked oscillator that includes the analog phase shifter of FIG. 3.

One important application of a phase shifter is a high performance Phase Locked Oscillator (PLO). An exemplary 10 GHz PLO 170, FIG. 11, includes a low noise amplifier 172 as the active device. The output signal of amplifier 172 is fed to a dielectric resonator 174 having a high quality factor, which exhibits resonance for a narrow range of frequencies. The output of dielectric resonator 174 is fed into phase shifter 30$a$, which provides a total amount of 360 degree phase shift at the desired resonance frequency in the closed loop. The output signal from phase shifter 30$a$ is then fed back to amplifier 172 to provide positive feedback to sustain the oscillation.

Due to temperature and supply voltage variations, a small phase error (e.g., in a range of +/−10 degrees) may occur. In order to reduce the phase noise and the spurious level, phase shifter 30$a$ is used to accurately and dynamically correct the phase error. A phase locked loop 176 is used to provide a dynamic control voltage to the phase shifter 30$a$. A directional coupler 178 provides a portion of the RF output signal on line 180 to a prescaler 182. Prescaler 182 divides the frequency of the RF signal by N times, i.e., from 10 GHz to 100 MHz for example. The output signal from prescaler 182 and a reference signal from a high accuracy oven-controlled crystal oscillator (OCXO) reference clock 184 are fed into a phase detector 186, which generates a voltage signal based on the difference in phase between two input signals. The voltage signal from phase detector 186 is fed through a loop filter 188 which helps to maintain the DC portion and get rid of the higher order harmonics. The filtered DC control voltage signal is applied to phase shifter 30$a$ to dynamically correct the phase shift error and maintain a 360 degree total phase shift in the loop independent to temperature and supply voltage variations.

In order to achieve low phase noise, high output power and low spurious level for the PLO applications, the phase shifter preferably includes the following features: high phase tuning accuracy over frequency, low insertion loss, continuous tuning over 360 degrees phase shift range and simple control. These features are satisfied by one or more embodiments of the subject invention.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments. For example, the low, high and all-pass filters may each have different configurations than the preferred embodiments disclosed herein. Also, although the above embodiments show the use of one all-pass filter, low-pass filter, and high-pass filter, this is not a limitation of the invention since more than one all-pass filter, low-pass filter, and/or high-pass filter may be used with the phase shifter of the subject invention.

Other embodiments will occur to those skilled in the art and are within the following claims.

What is claimed is:

1. A phase shifter, comprising:
an RF input terminal;
an RF output terminal;
a tunable low-pass filter, a tunable high-pass filter, and a tunable all-pass filter coupled in series between the low-pass filter and the high-pass filter, one of the low-pass filter and the high-pass filter coupled to the RF input terminal and the other coupled to the RF output terminal, said filters being responsive to a DC tuning signal for controlling the phase of an RF signal over a wider range of frequencies.

2. The phase shifter of claim 1 in which a center frequency of the all-pass filter is approximately a center frequency of the phase shifter.

3. The phase shifter of claim 1 in which the all-pass filter is coupled in series between the low-pass filter and the high-pass filter.

4. The phase shifter of claim 1 in which the low-pass filter is a fifth order filter or higher.

5. The phase shifter of claim 4 in which the low-pass filter is a fifth order filter and includes two inductors in series with the input terminal and three variable capacitors each coupled between ground and at least one of the terminals of the two inductors.

6. The phase shifter of claim 5 in which the variable capacitors each include a varactor diode.

7. The phase shifter of claim 1 in which the high-pass filter is a fifth order filter or higher.

8. The phase shifter of claim 7 in which the high-pass filter is a fifth order filter and includes two pairs of variable capacitors all coupled in series, each pair having a junction therebetween, and first and second inductors each coupled between ground and one of the junctions.

9. The phase shifter of claim 8 in which the variable capacitors include a varactor, and the phase shifter further includes a plurality of resistances and RF chokes each coupled in series between a DC bias control terminal and one of the varactors.

10. The phase shifter of claim 1 in which the high-pass filter is tunable by a DC control signal at the DC bias control terminal.

11. The phase shifter of claim 10 in which the DC bias control terminal is also coupled to the low-pass and all-pass filters such that each of the filters is tuned simultaneously with the DC bias control signal.

12. The phase shifter of claim 11 in which the DC bias control terminal is coupled to each one or more varactors in each of the filters through one or more bias chokes.

13. The phase shifter of claim 1 in which the all-pass filter section includes: two inductors coupled in series between the input and output of the all-pass filter; two series coupled variable capacitors coupled in parallel with the two inductors; a shunt variable capacitor coupled to a junction between the two inductors; and a shunt bias network coupled to a junction between the two variable capacitors.

14. The phase shifter of claim 13 in which the shunt bias network includes a resistance in series with an RF choke coupled between ground and the junction between the two variable capacitors.

15. The phase shifter of claim 1 in which the low-pass filter has a cut-off frequency at or above the highest frequency in a frequency pass band of the phase shifter.

16. The phase shifter of claim 1 in which the high-pass filter has a cut-off frequency at or below the lowest frequency in a frequency pass band of the phase shifter.

17. The phase shifter in claim 1 in which the frequency band is approximately one octave or more.

18. A wideband analog phase shifter, comprising:
an RF input terminal;
an RF output terminal;
a tunable low-pass filter;
a tunable high-pass filter, one of the low-pass filter and the high-pass filter coupled to the RF input terminal and the other coupled to the RF output terminal; and
a tunable all-pass filter coupled in series between the low-pass filter and the high-pass filter and responsive to a DC tuning signal for controlling the phase of an input RF signal over a wide range of frequencies.

19. A phase locked oscillator, comprising:
an amplifier for providing an output signal;
a prescaler responsive to the amplifier for providing a divided output signal;
a phase detector responsive to a reference signal and the prescaler for providing a control signal representative of the phase difference between the reference signal and the signal from the prescaler; and
a loop filter responsive to the phase detector for filtering the control signal to provide a filtered control signal; and
an analog phase shifter responsive to the loop filter for controlling the oscillator frequency and phase, the phase shifter including:
an RF input terminal;
an RF output terminal;
a low-pass filter, a high-pass filter, and an all-pass filter coupled in series between the RF input and the RF output terminals of the phase shifter, said filters tunable for controlling the phase of a signal over a wide range of frequencies.

20. A phase shifter, comprising:
an RF input terminal;
an RF output terminal;
a tunable low-pass filter, a tunable high-pass filter, and a tunable all-pass filter coupled in series between the RF input and the RF output terminals of the phase shifter, said filters being responsive to a DC tuning signal for controlling the phase of an RF signal over a wide range of frequencies, each said filter configured to provide approximately constant transmission phase change over a frequency band ranging from the low-pass filter cutoff frequency to the high-pass filter cutoff frequency as a function of a common filter tuning signal.

* * * * *